(12) United States Patent
Abbasi et al.

(10) Patent No.: US 8,610,473 B2
(45) Date of Patent: Dec. 17, 2013

(54) PHASE LOCK LOOP WITH ADAPTIVE LOOP BANDWIDTH

(75) Inventors: Saeed Abbasi, Valley Forge, PA (US); Michael R. Foxcroft, Toronto (CA); Thomas Y. Wong, Markham (CA)

(73) Assignee: Advanced Micro Devices, Inc., Sunnyvale, CA (US)

( * ) Notice: Subject to any disclaimer, the term of this patent is extended or adjusted under 35 U.S.C. 154(b) by 59 days.

(21) Appl. No.: 13/325,795

(22) Filed: Dec. 14, 2011

(65) Prior Publication Data
US 2013/0154695 A1   Jun. 20, 2013

(51) Int. Cl.
*H03L 7/06* (2006.01)
(52) U.S. Cl.
USPC .......................................... 327/156; 327/147
(58) Field of Classification Search
USPC .................................................. 327/147, 156
See application file for complete search history.

(56) References Cited

U.S. PATENT DOCUMENTS

| | | | |
|---|---|---|---|
| 5,233,314 A * | 8/1993 | McDermott et al. | 331/17 |
| 5,254,955 A * | 10/1993 | Saeki et al. | 327/156 |
| 6,646,512 B2 | 11/2003 | Abassi et al. | |
| 7,138,838 B2 * | 11/2006 | Shibahara et al. | 327/157 |
| 7,948,286 B2 * | 5/2011 | Yen et al. | 327/157 |
| 8,248,121 B2 * | 8/2012 | Lee | 327/156 |
| 8,279,992 B1 * | 10/2012 | Li | 375/376 |
| 2004/0207437 A1 * | 10/2004 | Shibahara et al. | 327/156 |
| 2010/0073051 A1 * | 3/2010 | Rao et al. | 327/157 |
| 2010/0214031 A1 * | 8/2010 | Yamamoto et al. | 331/34 |
| 2011/0080199 A1 * | 4/2011 | Yen et al. | 327/157 |
| 2012/0105115 A1 * | 5/2012 | Yamamoto et al. | 327/156 |
| 2012/0119801 A1 * | 5/2012 | Hsieh et al. | 327/156 |
| 2012/0126866 A1 * | 5/2012 | Hsieh et al. | 327/157 |
| 2012/0280729 A1 * | 11/2012 | August et al. | 327/156 |

* cited by examiner

*Primary Examiner* — Adam Houston

(57) ABSTRACT

The loop bandwidth of a PLL is adjusted based on a difference between the output signal of the PLL and the PLL reference signal. In an embodiment, the DC open loop gain and natural frequency of the PLL are adjusted based on the phase difference between the output signal and the reference signal, so that the loop bandwidth of the PLL is increased when the phase difference is outside a programmable range and is decreased when the phase difference is within the programmable range.

17 Claims, 4 Drawing Sheets

PHASE LOCK LOOP WITH ADAPTIVE LOOP BANDWIDTH

BACKGROUND

1. Field of the Disclosure

The present disclosure generally relates to electronic devices and more particularly to electronic devices having a phase lock loop.

2. Description of the Related Art

Electronic devices typically employ at least one phase lock loop (PLL) to synchronize an output signal of the PLL with a reference signal. The PLL uses a feedback loop to adjust the frequency and phase of the output signal until they are in a deterministic relationship with the frequency and phase of the reference signal.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-5 illustrate techniques for adapting the loop bandwidth of a PLL based on a difference between the output signal of the PLL and the PLL reference signal. In an embodiment, the DC open loop gain and natural frequency of the PLL are adjusted based on the phase difference between the output signal and the reference signal, so that the loop bandwidth of the PLL is increased when the phase difference is outside a programmable range and is decreased when the phase difference is within the programmable range. By adapting the loop bandwidth according to the difference between the output signal and the reference signal, the PLL can more quickly lock to the reference signal while also reducing the amount of signal overshoot.

To illustrate, according to one embodiment of the present disclosure the DC open loop gain depends on the magnitude of current applied to an input of a charge pump of the PLL. In response to a phase detector indicating the phase difference between the output signal and the reference signal is within a programmable range, the amount of current applied to the charge pump input is increased, thereby increasing the DC open loop gain. In response to a determination that the phase difference is within the programmable range, the amount of current applied to the charge pump input is reduced, thereby reducing the DC open loop gain. Thus, the loop bandwidth of the PLL is automatically and dynamically adjusted according to the phase difference between the output and reference signals, reducing overshoot and increasing the speed with which the output signal is locked.

Figure 1:
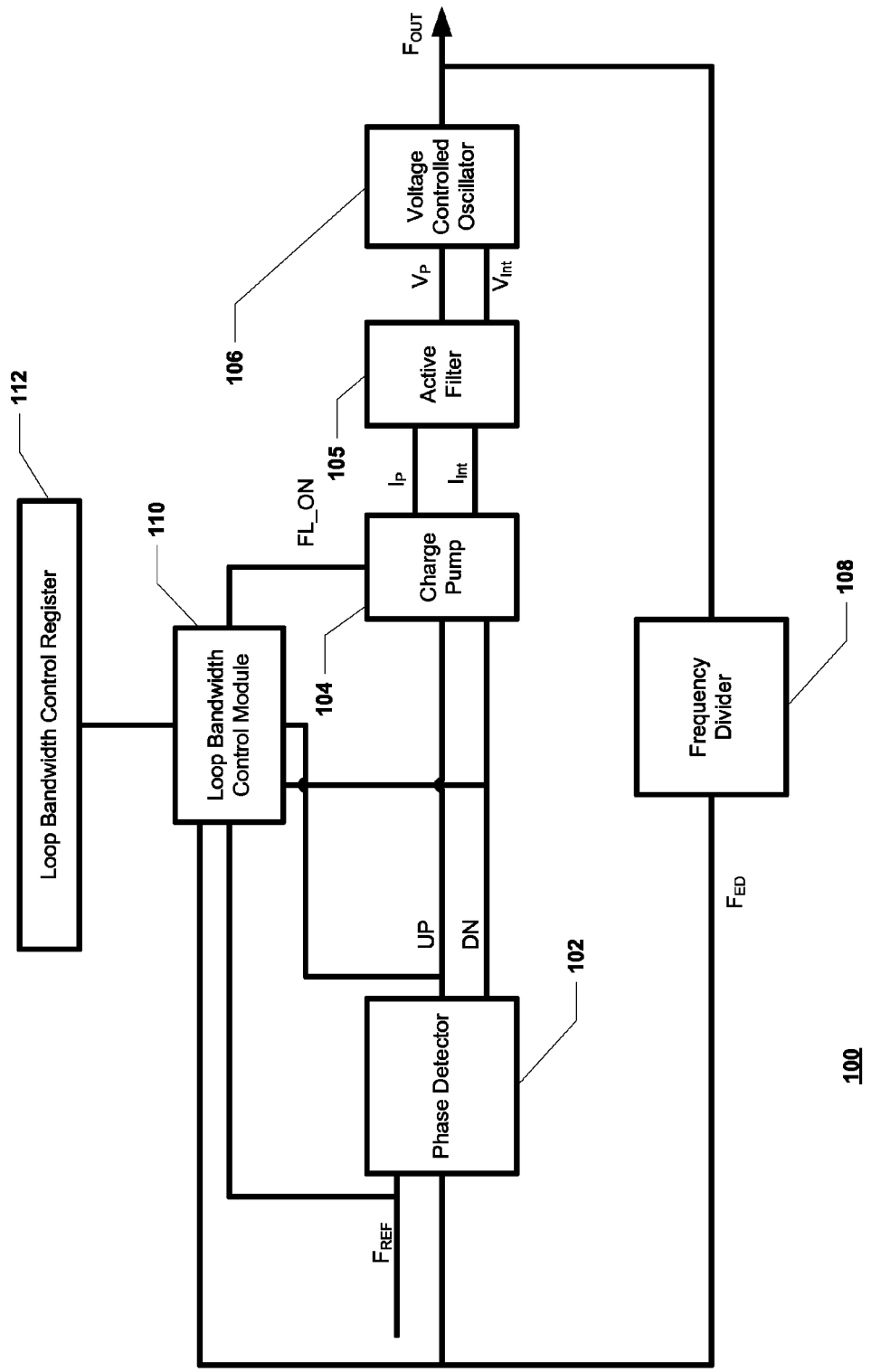
FIG. 1 is a block diagram of a phase lock loop in accordance with one embodiment of the present disclosure.
Figure 2:
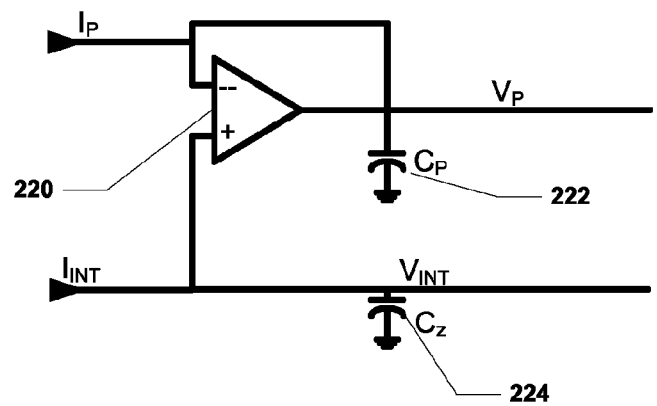
FIG. 2 is a circuit diagram of the active filter of FIG. 1 in accordance with one embodiment of the present disclosure.

FIG. 1 illustrates a block diagram of a PLL 100 in accordance with one embodiment of the present disclosure. The PLL 100 includes a phase detector 102, a charge pump 104, an active filter 105, a voltage controlled oscillator 106 and a frequency divider 108. The phase detector 102 includes an input to receive a frequency reference signal $F_{REF}$, an input to receive a frequency feedback signal $F_{ED}$, and outputs to provide signals UP and DN. The active filter includes inputs to receive the signals UP and DN and outputs to provide the signals $I_P$ and $I_{Int}$. The charge pump 104 includes input to receive the signals $I_P$ and $I_{Int}$ and outputs to provide voltage signals $V_P$ and $V_{Int}$. The voltage controlled oscillator (VCO) 106 includes inputs to receive the signals $V_P$ and $V_{Int}$ and an output to provide a signal $F_{OUT}$. The frequency divider 108 includes an input to receive the signal $F_{OUT}$ and an output to provide the signal $F_{ED}$.

The connectivity of the phase detector 102, charge pump 104, active filter 105, VCO 106, and frequency divider 108 forms a feedback loop that, in operation, controls the frequency and phase of the signal $F_{OUT}$ to have a predictable and stable relationship to the frequency and phase of the signal $F_{REF}$. When the signal $F_{OUT}$ is maintained in the predictable and stable relationship to the signal $F_{REF}$, the signal $F_{OUT}$ is said to be locked to the signal $F_{REF}$.

The relationship of each of the phase detector 102, charge pump 104, VCO 106, and frequency divider 108 to the operation of the feedback loop is as follows: phase detector 102 is configured to determine the phase difference between the signal $F_{REF}$ and $F_{ED}$. Based on the determined phase difference, the phase detector sets the state of the signals UP and DN.

The charge pump 104 is configured to set the magnitudes and directions (whether current is provided (sourced) or drawn (sinked)) of the current signals $I_P$ and $I_{INT}$ based on the signals UP and DN. In an embodiment, the current is provided via the signals $I_P$ and $I_{INT}$ when the signal UP is asserted, and is drawn via the signals $I_P$ and $I_{INT}$ when the signal DN is asserted.

The active filter 105 is configured to set the magnitudes of the signals $V_P$ and $V_{INT}$ based on both on the magnitudes of the currents provided or drawn signals $I_P$ and $I_{INT}$, and the relative amount of time current is provided or drawn. Accordingly, because the direction of the currents associated with the signals $I_P$ and $I_{INT}$ are dependent upon the signals UP and DN, the magnitude of the voltage signals $V_P$ and $V_{INT}$ is based on the relative amount of time the signals UP and DN are asserted. Operation of the active filter 105 be better understood with reference to FIG. 2, which illustrates the active filter 105 in accordance with one embodiment of the present disclosure. In the illustrated embodiment, charge pump 104 includes an operational amplifier (op amp) 220, a capacitor 222 and a capacitor 224. The op amp 220 includes a first terminal to receive the signal $I_P$, a second terminal to receive the signal $I_{INT}$, and an output connected to the first terminal of the op amp 220 and to provide the signal $V_P$. The capacitor 222 includes a first terminal connected to the output of the op amp 220 and a second terminal connected to a ground voltage reference. The capacitor 224 includes a first terminal connected to the second terminal of the op amp 220 and a second terminal connected to the ground voltage reference.

In operation, the connectivity of the op amp 220 and the capacitors 222 and 224 is such that the capacitors are charged and discharged according to the magnitudes and direction of the currents carried by signals $I_P$ and $I_{INT}$. Further, the charge held by the capacitors 222 and 224 set the voltages $V_P$ and $V_{INT}$, respectively. Accordingly, the charge pump 104 varies the voltages $V_P$ and $V_{INT}$ based on the phase difference between the signals $F_{ED}$ and $F_{REF}$, as indicated by the signals UP and DN.

Returning to FIG. 1, the VCO 106 is configured to set the frequency and phase of the signal $F_{OUT}$ based on the voltages $V_P$ and $V_{INT}$. Accordingly, because these voltages vary based on the phase difference between the signals $F_{ED}$ and $F_{REF}$, the frequency and phase of the signal $F_{OUT}$ is also varied based on the phase difference. In particular, when the phase difference is at or below a threshold amount, the frequency and phase of the signal $F_{OUT}$ is maintained at substantially constant levels, thereby locking the signal $F_{OUT}$ to the signal $F_{REF}$.

The frequency divider 108 is configured to generate the signal $F_{ED}$ based on the signal $F_{OUT}$ such that the frequency of $F_{ED}$ is equal to the frequency of $F_{ED}$ divided by a constant value N. Because the signal $F_{ED}$ provides the feedback that determines adjustment of the signal $F_{OUT}$ relative to the signal $F_{ED}$, the value N determines, at least in part, the relationship between the phase and frequency of the signal $F_{REF}$ and the phase and frequency of the signal $F_{OUT}$ when the signal $F_{OUT}$ is locked. Accordingly, in a particular embodiment the value N is programmable, trimmable, or otherwise adjustable so that the phase and frequency relationships between $F_{OUT}$ and $F_{REF}$ can be adjusted.

In operation, the PLL 100 locks this signal $F_{OUT}$ to the signal $F_{REF}$ as follows: after a reset the signals $F_{REF}$ and $F_{OUT}$ will likely be in an indeterminate state, such that the frequency and phase relationships between the signals are indeterminate. The phase detector 102 measures the difference between the phase of the signals $F_{ED}$ and $F_{REF}$, thereby modifying the output voltages of the charge pump 104 and, commensurately, the frequency and phase of the signal $F_{OUT}$. The signal $F_{OUT}$ is fed back to the frequency divider 108, which in response provides the signal $F_{ED}$ to the phase detector 102 for comparison to the signal $F_{REF}$. The operation of the illustrated feedback loop is such that, over time, the signal $F_{OUT}$ will become locked to the signal $F_{REF}$.

The speed with which the PLL 108 is able to lock the signal $F_{OUT}$ is based on the loop bandwidth and DC open loop gain. The loop bandwidth is determined by the direct current (DC) open loop gain and the natural frequency of the PLL 108. In an embodiment, the DC open loop gain can be expressed as follows:

$$K = \frac{I_{Int} K_{VCO}}{2\pi}$$

Where K is the DC open loop gain, $I_{INT}$ is the magnitude of that current as provided by the charge pump 104, and $K_{VCO}$ is the gain associated with the VCO 106. The natural frequency can be expressed as follows:

$$\omega_n = \sqrt{\frac{I_{Int} K_{VCO}}{2\pi N\, C_z}}$$

where $\omega_n$ is the natural frequency of the loop and $C_Z$ is the capacitive value of the capacitor 224.

The PLL 100 includes a loop bandwidth control module 110 and a loop bandwidth control register 112 to change the loop bandwidth of the PLL 100 based on the phase difference between the signals $F_{REF}$ and $F_{OUT}$. In particular, the loop bandwidth control module 110 is configured to set the loop bandwidth to a relatively higher level when the phase difference is above a threshold and set the loop bandwidth to a relatively lower level when the phase difference is below the threshold. The allows the PLL 100 to lock the signal $F_{OUT}$ more quickly while also reducing overshoot and thereby conserving power.

To illustrate, the loop bandwidth control register 112 is configured to store a value that indicates a phase difference range. The bandwidth control register 112 is a programmable register so that the phase difference range can be set by one or more instructions executing at an instruction pipeline (not shown). In other embodiments the phase difference range can be indicated by non-volatile storage elements, such as a set of fuses, by other types of volatile storage, such as a memory, or can be a fixed value.

The loop bandwidth control module 110 is configured to adjust the loop bandwidth of the PLL 100 based on the relationship between the phase difference range, as indicated by the loop bandwidth control register 112, and the phase difference of the signals $F_{ED}$ and $F_{REF}$. To illustrate, as explained above, the loop bandwidth is proportional to the DC open loop gain of the PLL 100, which itself if proportional to the magnitude of the current $I_{INT}$. Accordingly, in response to determining the phase difference of the signals $F_{ED}$ and $F_{REF}$ is outside than the phase difference range, the loop bandwidth control module 110 increases the current $I_{INT}$, thereby increasing the loop bandwidth. In response to determining the phase difference of the signals $F_{ED}$ and $F_{REF}$ is within the phase difference range, the loop bandwidth control module 110 reduces the current $I_{INT}$, thereby reducing the loop bandwidth. The loop bandwidth control module thereby increases the speed at which the PLL 100 locks the signal $F_{OUT}$ to the signal $F_{REF}$ while maintaining a stable feedback loop and reducing the likelihood of overshoot.

In the illustrated embodiment, the loop bandwidth control module 110 controls the magnitude of the current provided by the signal $I_{INT}$ via control signaling provided to the phase detector 102. Based on the control signaling, the phase detector 102 increases or decreases the magnitude of the currents $I_{INT}$ and $I_P$. This can be better understood with reference to FIG. 3, which illustrates the charge pump 104 in accordance with one embodiment of the present disclosure.

Figure 3:
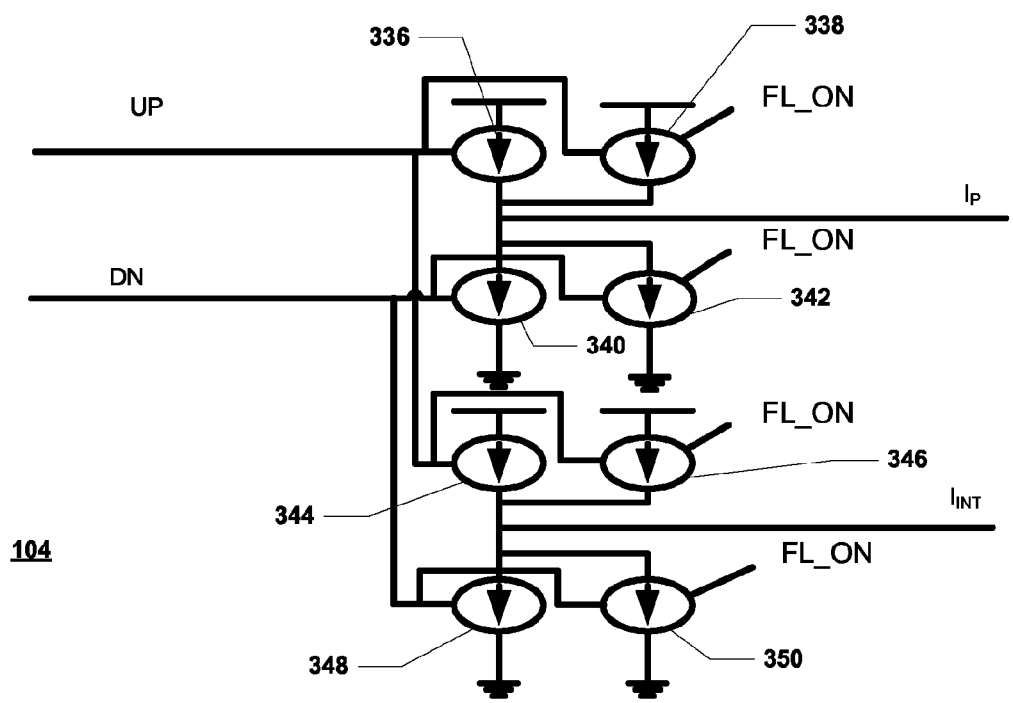
FIG. 3 is a block diagram of the charge pump of FIG. 1 in accordance with one embodiment of the present disclosure.

In the illustrated embodiment of FIG. 3, the phase detector 104 includes current sources 336, 338, 340, 342, 344, 346, 348, and 350. The current source 336 includes a first terminal connected to a voltage reference, a second terminal, and a control terminal to receive the signal UP. The current source 338 includes a first terminal connected to a voltage reference, a second terminal connected to the second terminal of the current source 336, a control terminal to receive the signal UP, and a control terminal to receive control signaling from the loop bandwidth control module 110.

The current source 340 includes a first terminal connected to the second terminal of the current source 336, a second terminal connected to a ground voltage reference, and a control terminal to receive the signal DN. The current source 340 includes a first terminal connected to the second terminal of the current source 336, a second terminal connected to a ground voltage reference, a control terminal to receive the signal DN, and a control terminal to receive control signaling from the loop bandwidth control module 110. The current source 344 includes a first terminal connected to a voltage reference, a second terminal, and a control terminal to receive the signal UP. The current source 346 includes a first terminal connected to a voltage reference, a second terminal connected to the second terminal of the current source 344, a control terminal to receive the signal UP, and a control terminal to receive control signaling from the loop bandwidth control module 110. The current source 348 includes a first terminal connected to the second terminal of the current source 344, a second terminal connected to a ground voltage reference, and a a control terminal to receive the signal DN. The current source 350 includes a first terminal connected to the second terminal of the current source 344, a second terminal connected to a ground voltage reference, a control terminal to receive the signal DN, and a control terminal to receive control signaling from the loop bandwidth control module 110.

The current sources 336, 338, 340, 342, 344, 346, 348, and 350 are each configured to provide or draw current depending on the control signals at their control inputs. In particular, current sources 336 and 344 are configured to provide current in response to assertion of the signal UP. Current sources 340 and 348 are configured to draw current in response to assertion of the signal DN. Current sources 338 and 346 are configured to provide current in response to assertion of the signal UP and assertion of the control signaling provided by the loop bandwidth control module 110. Current sources 342 and 350 are configured to draw current in response to assertion of the signal DN and assertion of the control signaling provided by the loop bandwidth control module 110. The combination of the currents provided and drawn by the current sources 336, 338, 340 and 342 are summed to form the current $I_P$, while the current sources 344, 346, 348, and 350 are summed to form the current $I_{INT}$.

In operation, based on the phase difference between the signals $F_{REF}$ and $F_{ED}$, the phase detector 102 asserts or negates the signals UP and DN, thereby controlling the direction of the currents $I_P$ and $I_{INT}$. This controls whether the frequency of the signal $F_{OUT}$ is increased or decreased. Further, based on the phase difference between the signals $F_{REF}$ and $F_{ED}$, the loop bandwidth control module 110 asserts or negates the control signaling, thereby controlling the magnitude of the currents $I_P$ and $I_{INT}$. This controls the loop bandwidth of the PLL 100, thereby controlling the speed at which the PLL locks the signal $F_{OUT}$.

It will be appreciated that the charge pump 104 illustrated in FIG. 3 adjusts the magnitudes of both the currents associated with the signals $I_P$ and $I_{INT}$ based on assertion of the control signaling from the loop control module 110. In other embodiments, the magnitudes of one of the currents associated with the signals $I_P$ and $I_{INT}$ is not adjusted based on the control signaling from the loop control module 110, such that the magnitude of the current is not affected by whether the phase difference of the signals $F_{REF}$ and $F_{ED}$ is outside the phase difference range. For example, in one embodiment only the magnitude of the current associated with the signal $I_{INT}$ is adjusted in response to assertion of the control signaling. That is, the loop bandwidth is controlled by adjustment of the current associated with the signal $I_{INT}$ only, and is not controlled by adjusting the magnitude of the current associated with the signal $I_P$.

Figure 4:
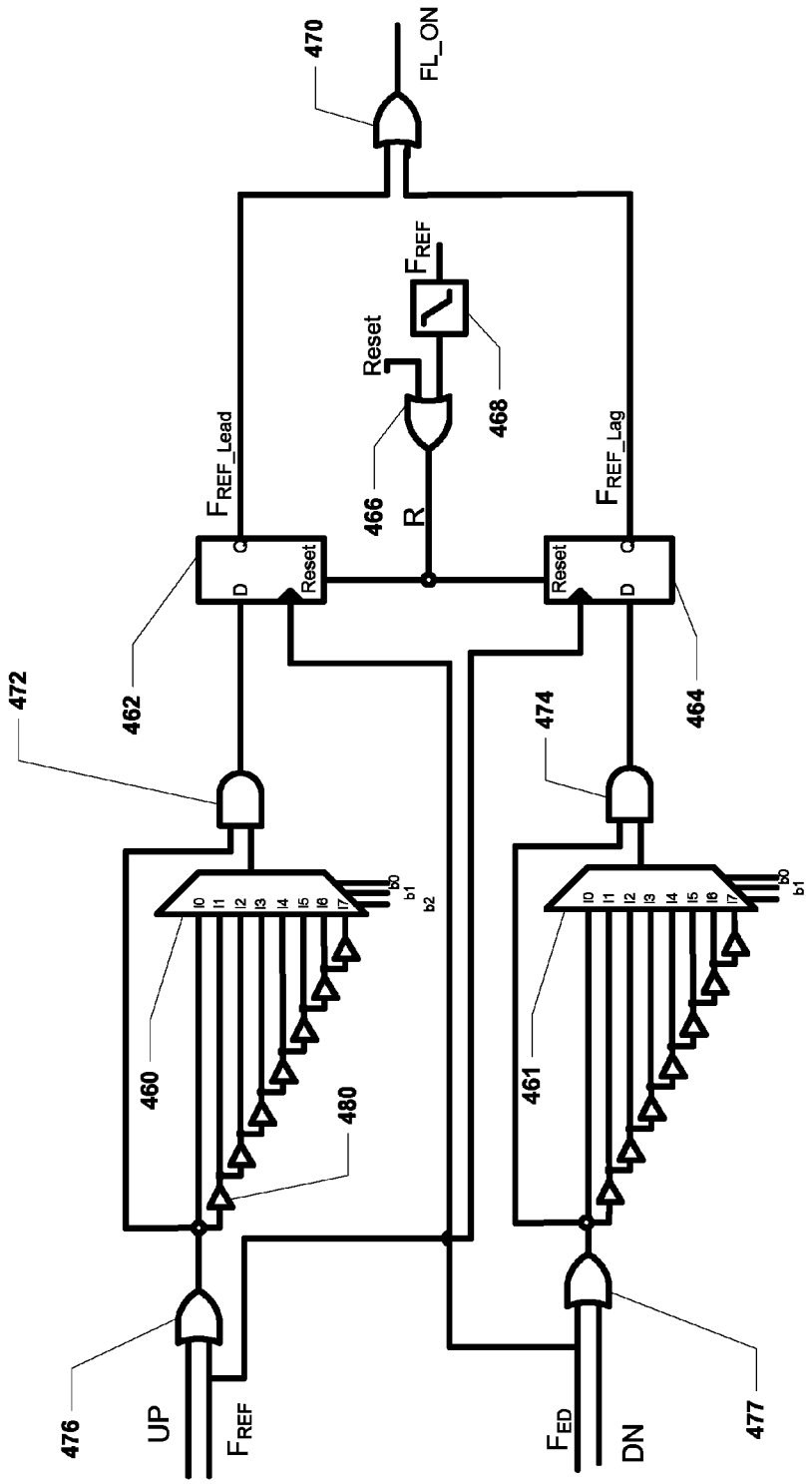
FIG. 4 is a block diagram of the loop bandwidth control module of FIG. 1 in accordance with one embodiment of the present disclosure.

FIG. 4 illustrates the loop bandwidth control module 110 in accordance with one embodiment of the present disclosure. The loop bandwidth control module 110 includes multiplexers 460 and 461, latches 462 and 464, AND gates 472 and 474, OR gates 466, 470, 476, and 477, and edge trigger 468. The OR gate 476 includes an input to receive the signal UP, an input to receive the signal $F_{REF}$, and an output. The OR gate 477 includes an input to receive the signal $F_{ED}$, an input to receive the signal DN, and an output. The multiplexer 460 includes a plurality of inputs, whereby each input is to receive a differently delayed representation of the output signal of OR gate 476. In particular, the output signal of OR gate 476 is provided to each of a plurality of buffers (such as buffer 480) connected in series, where the output of each of the plurality of buffers is connected to a corresponding input of the multiplexer 460 and to the next buffer in the series. Multiplexer 460 also includes control inputs to receive control signaling based on the phase difference threshold stored at the loop bandwidth control register 112. The multiplexer 461 includes a plurality of inputs, whereby each input is to receive a differently delayed representation of the output signal of OR gate 477. In particular, the output signal of OR gate 477 is provided to each of a plurality of buffers connected in series, where the output of each of the plurality of buffers is connected to a corresponding input of the multiplexer 461 and to the next buffer in the series. Multiplexer 460 also includes control inputs to receive the control signaling based on the phase difference threshold range stored at the loop bandwidth control register 112.

The AND gate 472 includes an input connected to to output of the OR gate 476, an input connected to an output of the multiplexer 460, and an output. The AND gate 474 includes an input connected to the output of the OR gate 477, an input connected to an output of the multiplexer 461, and an output. The latch 462 includes a data input connected to the output of the AND gate 472, a data output, a clock input to receive the signal $F_{ED}$, and a reset input. The latch 464 includes a data input connected to the output of the AND gate 474, a data output, a clock input to receive the signal $F_{REF}$, and a reset input. The edge trigger 468 includes an input to receive the signal $F_{REF}$ and an output to provide a pulse in response to an edge of the signal $F_{REF}$. The OR gate 466 includes an input to receive a RESET signal, an input connected to the output of the edge trigger 468, and an output connected to the reset inputs of the latches 462 and 464. The OR gate 470 includes an input connected to the data output of the latch 462, an input connected to the data output of the latch 464, and an output to provide control signaling to the charge pump 104.

In operation, the connectivity of the illustrated modules of the loop bandwidth control module 110 result in the data output of the latch 462 being asserted when the signal $F_{REF}$ leads the signal $F_{ED}$ by more than a threshold amount (referred to herein as the lead threshold), and in the data output of the latch 464 being asserted when the signal $F_{REF}$ lags the signal $F_{ED}$ by more than a threshold amount (referred to herein as the lag threshold). The lead and lag thresholds set the boundaries of the phase difference range.

The control signaling provided to the charge pump 104 will be asserted, thereby increasing the open loop bandwidth of the PLL 100, when the signal $F_{REF}$ leads or lags the signal $F_{ED}$ by more than the lead and lag thresholds respectively. The control signaling is negated, thereby reducing the open loop bandwidth, when the signal $F_{REF}$ leads or lags the signal $F_{ED}$ by less than the lead and lag thresholds respectively.

The lead threshold is determined by the selected input at the multiplexer 460. In particular, based on the value stored at the loop bandwidth control register 112, a signal at one of the inputs of the multiplexer 460 is selected for provision to the AND gate 472. Each of the inputs receives a representation of the signal $F_{REF}$ having a different delay. The selected delay thereby determines the lead threshold. The lag threshold is similarly selected at the multiplexer 461.

The connectivity of the edge trigger 468 and the OR gate 466 results in the latches 462 and 464 being reset in response to assertion of the RESET signal. In an embodiment, the RESET signal is asserted in response to system resent events, such as a power on reset event.

Figure 5:
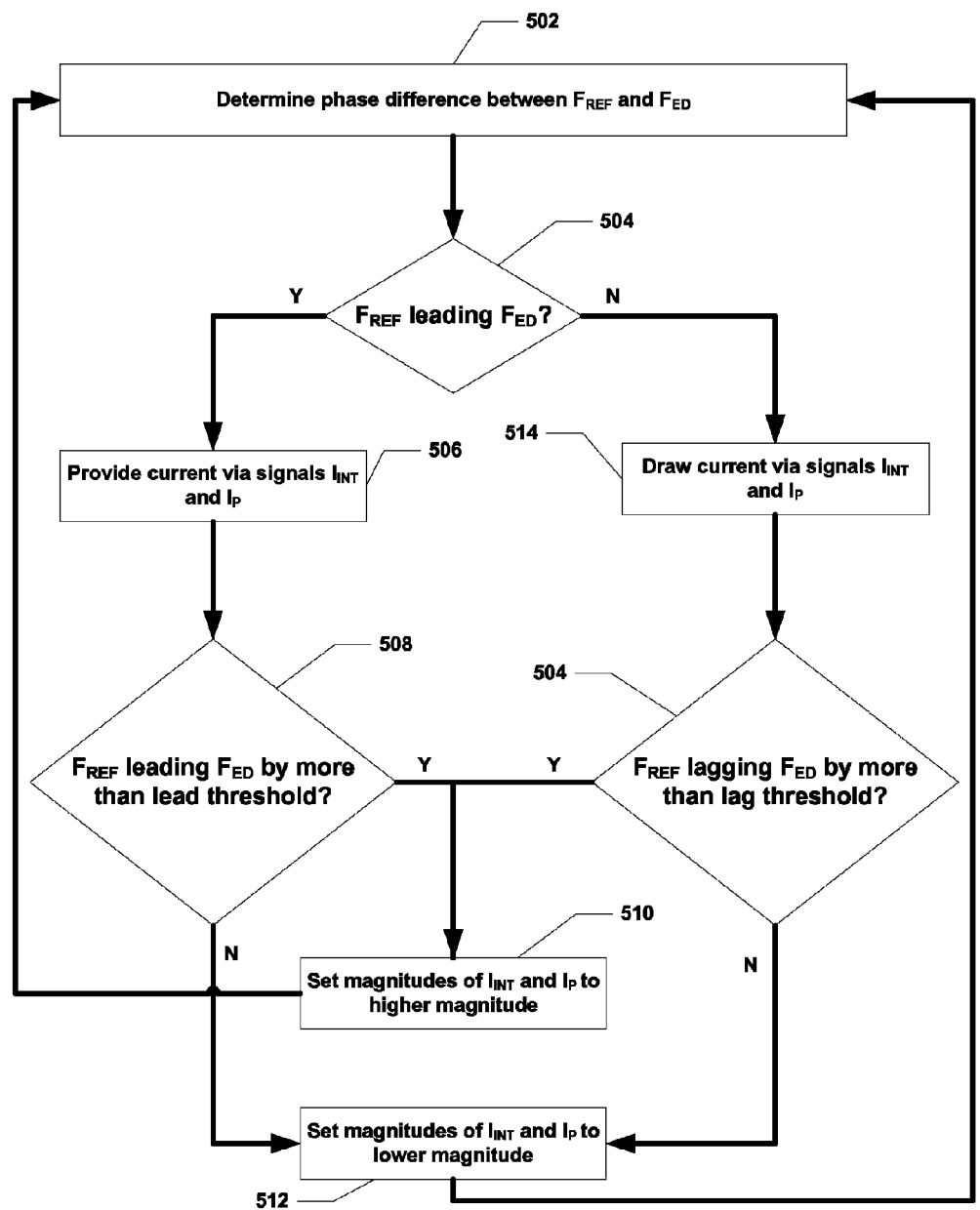
FIG. 5 is a flow diagram of a method of controlling the loop bandwidth of the phase lock loop of FIG. 1 in accordance with one embodiment of the present disclosure.

FIG. 5 illustrates a flow diagram of a method of changing the open loop bandwidth of the PLL 100 in accordance with one embodiment of the present disclosure. At block 502, the phase detector 102 determines the phase difference between the signals $F_{REF}$ and $F_{ED}$. At block 504, the phase detector 102 determines whether the signal $F_{REF}$ is leading the signal $F_{ED}$. If so, the method flow moves to block 506 and the phase detector 102 provides current via the signals $I_{IT}$ and $I_P$. At block 508 the loop bandwidth control module 110 determines whether the signal $F_{REF}$ is leading the signal $F_{ED}$ by more than the lead threshold as indicated by the loop bandwidth control register 112. If so, the method flow moves to block 510 and the loop bandwidth control module 110 sets the magnitude of the currents provided by the signals $I_{INT}$ and $I_P$ to a higher level, thereby setting the loop bandwidth to a relatively higher level. If the signal $F_{REF}$ is leading the signal $F_{ED}$ by less than the lead threshold, the method flow proceeds to block 512 and the loop bandwidth control module 110 sets the magnitude of the currents provided by the signals $I_{INT}$ and $I_P$ to a lower level, thereby setting the loop bandwidth to a lower level.

Returning to block 504, if the phase detector 102 determines the signal $F_{REF}$ is lagging the signal $F_{ED}$, the method flow moves to block 514 and the phase detector 102 draws current via the signals $I_{INT}$ and $I_P$. At block 504 the loop bandwidth control module 110 determines whether the signal $F_{REF}$ is lagging the signal $F_{ED}$ by more than the lag threshold as indicated by the loop bandwidth control register 112. If so, the method flow moves to block 510 and the loop bandwidth control module 110 sets the magnitude of the currents drawn by the signals $I_{INT}$ and $I_P$ to a higher level, thereby setting the loop bandwidth to a relatively higher level. If the signal $F_{REF}$ is lagging the signal $F_{ED}$ by less than the lag threshold, the method flow proceeds to block 512 and the loop bandwidth control module 110 sets the magnitude of the currents drawn by the signals $I_{INT}$ and $I_P$ to a lower level, thereby setting the loop bandwidth to a lower level.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. A method, comprising:
    adjusting a loop bandwidth of a phase lock loop (PLL) by changing a magnitude of a current applied to a first input node of a charge pump of the PLL based on a difference between an output signal of the PLL and a reference signal of the PLL to lock the output signal to the reference signal.

2. The method of claim 1, wherein adjusting the loop bandwidth comprises changing a direct current (DC) open loop gain of the PLL based on the difference between the output signal and the reference signal.

3. The method of claim 1, wherein adjusting the loop bandwidth comprises changing a natural frequency of the PLL based on the difference between the output signal and the reference signal.

4. The method of claim 1, wherein the difference between the output signal and the reference signal comprises a phase difference.

5. The method of claim 1, wherein adjusting the loop bandwidth comprises changing a magnitude of a second current applied to a second input node of the charge pump based on the difference between the output signal and the reference signal.

6. The method of claim 5, wherein the first node comprises a first input of a charge pump of the PLL and the second node comprises a second input of the charge pump.

7. A method, comprising:
    in response to determining a phase difference between an output signal of a phase lock loop (PLL) and a reference signal is in a first relationship to a reprogrammable threshold, setting a loop bandwidth of the PLL to a first level; and
    in response to determining the phase difference between the output signal and the reference signal is in a second relationship to the reprogrammable threshold, setting a loop bandwidth of the PLL to a second level.

8. The method of claim 7, further comprising:
    selecting a delay from a plurality of delays based on the reprogrammable threshold;
    applying the delay to the output signal of the PLL to determine a delayed output signal; and
    wherein determining the phase difference between the output signal and the reference signal comprises determining the phase difference based on a comparison of the delayed output signal to the reference signal.

9. The method of claim 7, wherein:
    setting the loop bandwidth to the first level comprises applying a current of a first magnitude to a first input node of a charge pump of the PLL; and
    setting the loop bandwidth to the second level comprises applying a current of a second magnitude to a second input node of a charge pump of the PLL.

10. A device comprising:
    a phase lock loop (PLL) having an adjustable loop bandwidth, the loop bandwidth based on a difference between an output signal of the PLL and a reference signal of the PLL, the PLL comprising:
    a charge pump comprising a first input node, wherein the PLL is to adjust the loop bandwidth by changing a magnitude of a current applied to the first input node of the PLL.

11. The device of claim 10, wherein the PLL has an adjustable direct current (DC) open loop gain based on the difference between the output signal and the reference signal.

12. The device of claim 10, wherein the PLL has an adjustable natural frequency based on the difference between the output signal and the reference signal.

13. The device of claim 10, wherein the difference between the output signal and the reference signal comprises a phase difference.

14. The device of claim 10, wherein the charge pump includes a first output to provide a first current, a magnitude of the first current based on the difference between the output signal and the reference signal.

15. The device of claim 14 further comprising an active filter comprising a first input coupled to the first output of the charge pump.

16. The device of claim 14, wherein the charge pump comprises a second input node, the PLL to adjust the loop bandwidth by changing a magnitude of a current applied to the second input node of the charge pump.

17. The device of claim 16, further comprising a voltage controlled oscillator coupled to the first output of the charge pump.

* * * * *